United States Patent [19]
Kotachi et al.

[11] Patent Number: 5,104,479
[45] Date of Patent: Apr. 14, 1992

[54] RESIST MATERIAL FOR ENERGY BEAM LITHOGRAPHY AND METHOD OF USING THE SAME

[75] Inventors: Akiko Kotachi, Yokohama; Satoshi Takechi, Machida; Yuko Nakamura, Kawasaki, all of Japan

[73] Assignee: Fujitsu Limited, Kawasaki, Japan

[21] Appl. No.: 605,351

[22] Filed: Oct. 30, 1990

Related U.S. Application Data

[62] Division of Ser. No. 468,083, Jan. 22, 1990, Pat. No. 5,066,751.

[30] Foreign Application Priority Data

Jan. 20, 1989 [JP] Japan .................... 1-012447

[51] Int. Cl.$^5$ ............................. B44C 1/22
[52] U.S. Cl. ......................... 156/643; 156/668
[58] Field of Search .................. 156/643, 668

[56] References Cited
FOREIGN PATENT DOCUMENTS 0271708 6/1988 European Pat. Off. .
59-197036 11/1984 Japan .
62-229141 10/1987 Japan .

Primary Examiner—Joseph L. Schofer
Assistant Examiner—N. Sarofim
Attorney, Agent, or Firm—Staas & Halsey

[57] ABSTRACT

A positive-type resist material for forming resist patterns having submicron geometries on a substrate, the resist material comprising a copolymer of a first monomer of silicon containing methacrylic ester and a second monomer of either acrylic ester or acrylonitrile, the alpha-position of the second monomer being substituted by an electron attracting group. The first monomer has a high resistance to an oxygen plasma and the second monomer has a high sensitivity to e-beam/X-ray irradiation. As the electron attracting group, a trifluoromethyl group, a halogen group, a cyano group and a $CH_2CO_2R$ group are used. The embodied first monomers are trimethylsilylmethyl methacrylate and (diphenylmethylsilyl)methyl methacrylate, and the embodied second monomers are α-trifluoromethyl (2,2,2-trifluoroethyl) acrylate and α-chloroacrylonitrile.

2 Claims, 2 Drawing Sheets

RESIST MATERIAL FOR ENERGY BEAM LITHOGRAPHY AND METHOD OF USING THE SAME

This is a divisional of copending application Ser. No. 07/468,083 filed on Jan. 22, 1990, now U.S. Pat. No. 5,066,751.

BACKGROUND OF THE INVENTION

1. Field of the Invention

This invention relates to a resist material having a high resistance to an oxygen containing plasma etchant and a high sensitivity to an energy beam such as an electron beam and an X-ray exposure beam, and more particularly to a resist material for use in an electron-beam or X-ray lithography process for forming patterns of submicron geometries and a method of using the resist material.

2. Description of the Related Art

In fabricating a semiconductor integrated circuit, thin film technology and photolithography technology are widely used. With a trend toward higher integration of integrated circuits, an electron beam or X-ray lithography (hereinafter, an "energy beam lithography process", such as an electron beam and an X-ray lithography process is abbreviated as e-beam/X-ray lithography) is gradually being put into practical application in fabricating LSIs or VLSIs.

In the photolithography technology, for example, in forming aluminum patterns of wirings on a semiconductor substrate, a resist layer is coated on a thin aluminum layer. The resist layer is selectively exposed to ultraviolet rays using a mask and then developed, resulting in forming resist patterns through which the aluminum layer is selectively exposed. Thereafter, the substrate is subjected to either a wet or dry etching process for removing the exposed portions of the aluminum layer. The remaining resist layer then is removed by an ashing process, and the desired aluminum pattern thus is formed on the substrate.

The above photolithography has resolution limitations of around 1 micron and, therefore, is not suitable for forming a resist pattern having dimensions less than 1 micron.

On the other hand, the e-beam/X-ray lithography utilizes irradiation of much shorter wavelength for exposure than those used in photolithography. In the e-beam lithography, an electron beam having an energy level of about 20 to 30 KeV (Kilo-electron-Volts) corresponding to about 0.1 Å in wavelength is irradiated onto and swept over a resist layer. In the X-ray lithography, an X-ray source capable of radiating X-rays of several Å in wavelength is utilized. Therefore, the e-beam/X-ray lithography is suitable for forming resist patterns having dimensions of less than 1 micron, in other words, to form fine patterns of submicron geometries.

There is another factor which deteriorates the quality of formed resist patterns. In some cases, a specific layer to be patterned by a e-beam/X-ray lithography process has a step structure on the substrate, the step being formed by an underlying structure, previously formed. The step has sometimes a height of 1 to 2 microns. When a single resist layer is used in lithography, fine resist patterns can not be achieved in such a case.

In order to solve the above step problem, a multilayer resist method has been developed and applied. In a simple case, a double-layer resist method is used. A first (lower) resist layer serves the function of planing the substrate surface and has a comparatively large thickness. Phenolnovolak resin or cresolnovolak resin, for example, is used as a material for the first resist layer. The material of the first resist layer is selected from those which are easily removed by a dry etching process comprising oxygen plasma. The first resist layer is coated on the substrate by a spin-coat method and has a thickness of, for example, about 2 microns, and has a flat surface. A second (upper) resist layer is coated on the first resist layer and has a thickness of about 0.2 to 0.3 microns. Material of the second resist layer is required to have a high resistance to the oxygen-containing plasma.

When the second resist layer is exposed selectively by an e-beam and developed, the remaining second resist layer patterns exhibit a high resistance during the subsequent dry etching process containing oxygen plasma. Therefore, the second resist layer patterns are transferred to the underlying first resist layer, resulting in forming first resist layer patterns similar to the second resist layer patterns.

A homopolymer of trimethylsilylmethyl methacrylate, shown in the following structural formula (1), is a known positive-type resist material which has a high resistance against reactive ion etching (abbreviated as RIE) using an oxygen-containing gas.

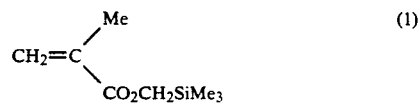

Though the above polymer exhibits a high resistance to the oxygen plasma during the dry etching, its sensitivity to the e-beam exposure is not good. To increase the sensitivity, Japanese Unexamined Patent Publication SHO-62-229141, is issued on Oct. 7, 1987 by Watanabe et al., discloses a polymer having a high sensitivity to the e-beam. A monomer disclosed in the reference, for example, has the following structural formula, wherein the alpha-methyl group of the trimethylsilylmethyl methacrylate shown by formula (1) is replaced by chlorine atom (Cl):

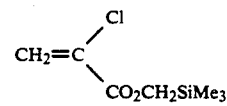

The above improved positive-type resist material has a most suitable range of e-beam irradiation intensity of less than a specified value. When the resist layer is subjected to irradiation by an e-beam of an intensity exceeding this range, the resist shows sometimes a negative-type characteristic.

The present invention provides a positive-type resist material which has a high resistance to oxygen plasma during dry etching and a high sensitivity to e-beam/X-ray irradiation and further is usable over a wide range of irradiation intensity.

SUMMARY OF THE INVENTION

A general object of the present invention is therefore, to provide a positive-type resist material having a high sensitivity to e-beam/X-ray irradiation for use as an outermost resist layer in a multilayer resist method.

A more specific object of the present invention is to provide a positive-type resist material having a high resistance to an oxygen plasma used in a subsequent dry etching process, as to the resist material is not exposed by e-beam/X-ray irradiation in a preceding process step and therefor remains after development of the resist layer.

Another object of the present invention is to provide a positive-type resist material having both characteristics of a high sensitivity to e-beam/X-ray irradiation and a high resistance to an oxygen plasma used in a subsequent dry etching process as to a portion of the resist material which was not exposed to the e-beam/X-ray irradiation in a preceding process step.

The above objects are achieved by the positive-type resist material of the present invention comprising a copolymer of a first monomer of silicon containing methacrylic ester and a second monomer of either acrylic ester or acrylonitrile, the alpha-position of the second monomer being substituted by an electron attracting group. The first monomer has a high resistance to the oxygen plasma used in a subsequent dry etching process step and the second monomer has a high sensitivity to e-beam/X-ray irradiation used in a preceding process step.

DETAILED DESCRIPTION OF THE PREFERRED EMBODIMENTS

At first, a method of forming fine patterns of resist layers in a lithography process is explained using a multilayer resist method.

Figure 1:
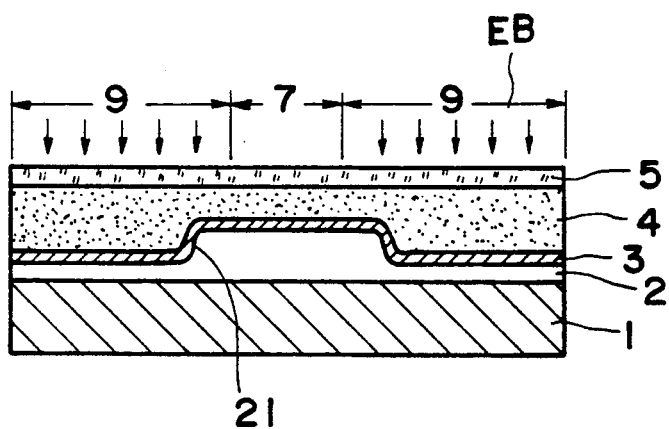
FIGS. 1 through 3 show schematic cross-sectional views of a semiconductor integrated circuit at different sequential steps when the resist material of the present invention is used in a double-layer resist method in lithography processes.

FIG. 1 shows schematically a partial cross section of a semiconductor structure when two resist layers are formed thereon. For clarity, a semiconductor substrate 1 is assumed to have a layer structure 2, which has been formed in previous fabrication processes and has a stepped portion 21. In order to form aluminum layer wiring patterns thereon, an aluminum layer 3 is first deposited on an entire surface of the layer structure 2. A first resist layer 4 of a thickness of about 2 microns is spin-coated on the aluminum layer 3. Phenolnovolak resin, for example, is used as a material of the first resist layer 4. Because the first resist layer 4 has a sufficient thickness to embed the stepped portion 21, the surface thereof is leveled, i.e., made planar. Thereafter, a second resist layer 5, which is prepared in accordance with the present invention, is coated on the first resist layer 4 and the resist layer 5 has a thickness of about 3000 Å.

Figure 2:
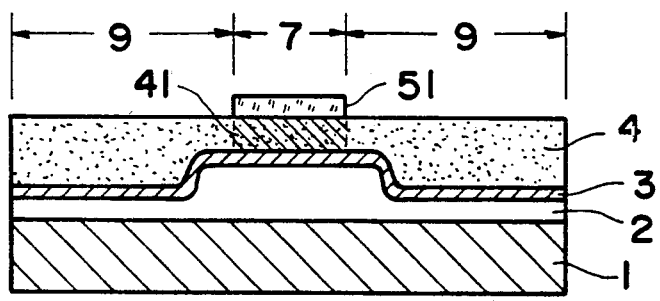

Surface regions 9 of the second resist layer 5 are selectively exposed to an e-beam. Thereafter, the second resist layer 5 is subjected to a development process. The portions of the resist layer 5 in the exposed regions 9 are removed and the patterned layer 51 in the non-exposed region 7 remains as shown in FIG. 2.

Next, the entire surface is subjected to a reactive ion etching (RIE) process using an oxygen-including gas, which has an anisotropic characteristic. The portions of the first resist layer 4 in the exposed regions 9 are removed and the aluminum layer 3 in these regions 9 is exposed in this process. However, because the second resist layer 51 has a high resistance to the oxygen plasma used in the RIE process, the patterned resist layer 51 remains with the underlying portion of the first resist layer 41 during this etching process.

Figure 3:
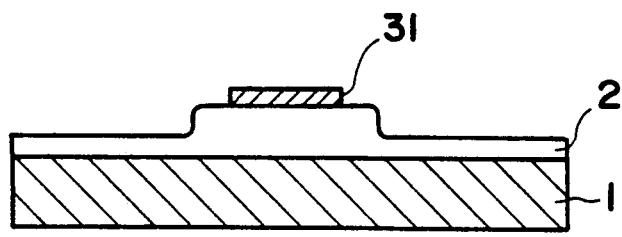

Next, the exposed aluminum layer 3 and the remaining second resist layer 51 are subjected to another dry etching process using a halide, for example, a chloride-compound-containing gas, and both layers are removed. Finally, the remaining and patterned first resist layer 41 is removed by an ashing process, leaving a fine aluminum layer pattern 31 shown in FIG. 3.

The resist material of the present invention comprises a copolymer of a first monomer of silicon containing methacrylic ester and a second monomer of either acrylic ester or acrylonitrile, the alpha-position of the second monomer having substituted thereof an electron attracting group.

The first monomer of silicon containing methacrylic ester is shown in the following general structural formula (2):

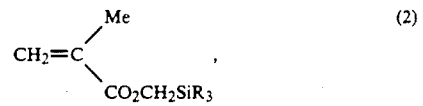

where R denotes an alkyl group or a phenyl group.

A homopolymer of the above silicon containing methacrylic ester exhibits a high resistance against oxygen plasma; however, it has poor sensitivity to e-beam/X-ray irradiation.

In order to improve the sensitivity to e-beam/X-ray irradiation, the resist material of the present invention comprises a copolymer which is copolymerized by the above first monomer shown by formula (2) and a second monomer of either acrylic ester or acrylonitrile, of which the alpha-position has substituted thereof an electron attracting group.

As an electron attracting group, any group selected from the trifluoromethyl group ($CF_3$), the halogen group, the cyano group (CN), and the $CH_2CO_2R$ group can be used. When the electron attracting group is denoted as X, one of the second monomers, acrylic ester, the alpha-position of which being substituted by X, is represented by the following structural formula:

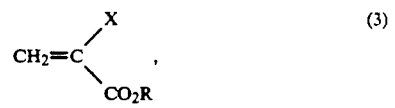

where R denotes an alkyl group or a phenyl group.

The other second monomer, acrylonitrile, having its alpha-position substituted by X, is represented by the following structural formula.

In copolymerizing the first and second monomers, the copolymerization ratio is preferably selected to be in a range from 10:1 to 2:1, and further the molecular weight of the copolymer is preferably in a range between 500,000 to 3,000,000.

1. First embodiment

When a trifluoromethyl group ($CF_3$) is used for X and a trifluoroethyl group ($CH_2CF_3$) is used for R in the formula (3), α-trifluoromethyl (2,2,2-trifluoroethyl) acrylate shown by the following formula (5) is utilized as the second monomer.

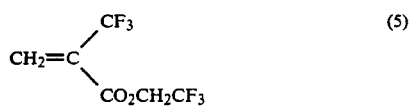
(5)

As a first monomer, trimethylsilylmethyl methacrylate wherein a methyl group is substituted for the alkyl group R in the formula (2), is used in the first embodiment.

The first and second monomers, trimethylsilylmethyl methacrylate and α-trifluoromethyl (2,2,2-trifluoroethyl) acrylate are copolymerized, and the copolymer has a copolymerization ratio of 7:3 and a molecular weight of about 800,000. The copolymer is dissolved in toluene, and the copolymer solution of 30 g/l is used as the positive-type resist material of the first embodiment.

Figure 4:
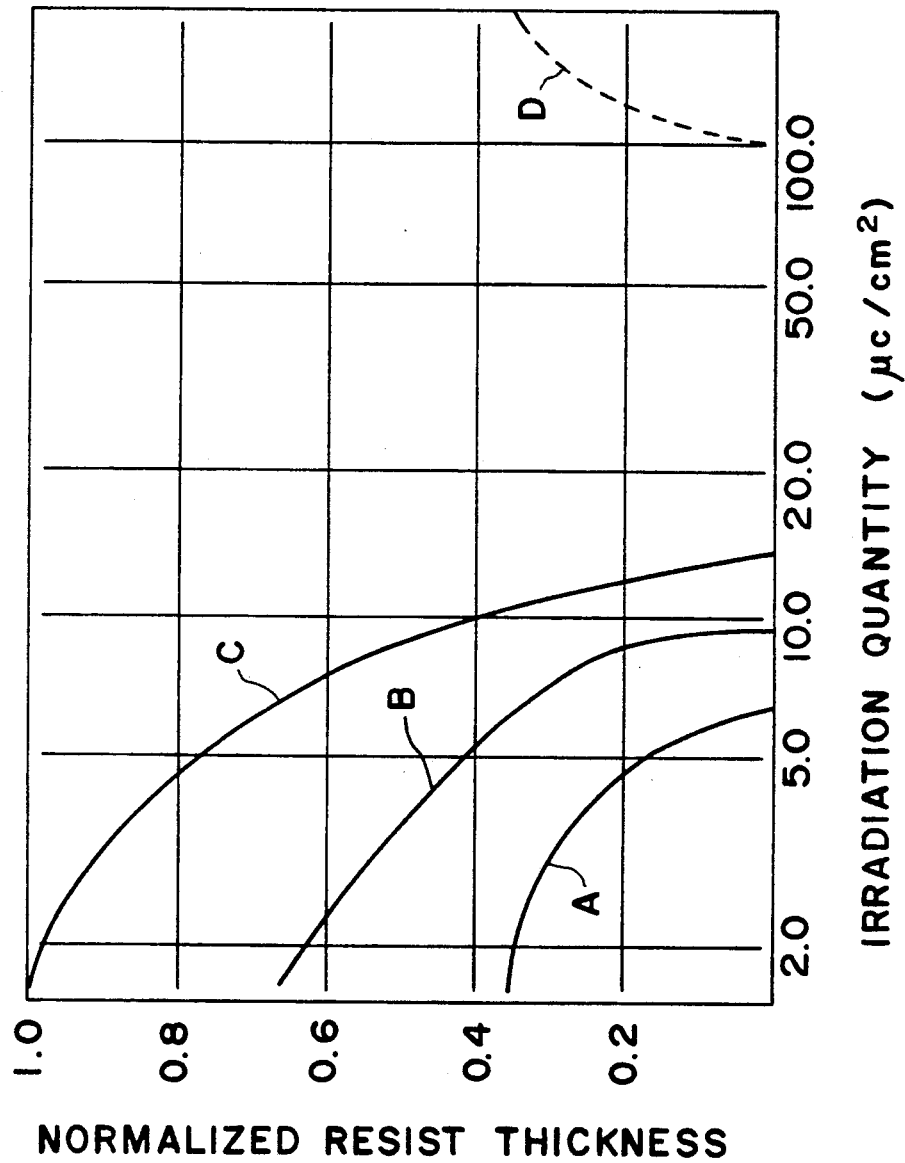
FIG. 4 shows sensitivity curves of exemplary resist materials (curves A and B) of the present invention and a known resist material (curve C) for comparison, and curve D in the figure shows that a typical known positive-type resist material has a negative-type characteristic when it is overexposed to e-beam irradiation.

The resist material of the first embodiment is coated on a silicon wafer to a thickness of about 3000 Å. After a baking process, the resist layer is subjected to an e-beam exposure step at an accelerating voltage of 20 KeV. After the exposure, the resist layer is developed in n-hexane for two minutes. In FIG. 4, the sensitivity of the resist material of the first embodiment is shown by curve A, the sensitivity curves of FIG. 4 relate the normalized remaining resist thickness of a respective material to the irradiation intensity. It is found that this resist material has a sensitivity of about 6.4 $\mu C/cm^2$.

As a test for obtaining data of the resistance to an oxygen plasma, the resist material of the first embodiment was subjected to RIE for 20 minutes under conditions of oxygen gas flow of 50 sccm, vacuum degree (i.e., pressure) of 0.15 Torr and input RF (radio frequency) power of 300 watts. The test result revealed shows that the thickness consumption of the resist layer was about 1000 Å.

2. Second embodiment

In the second embodiment, α-trifluoromethyl (2,2,2-trifluoroethyl) acrylate shown by the formula (5) was used as a second monomer.

(Diphenylmethylsilyl)methyl methacrylate shown by the following formula (6), wherein the groups R in the formula (2) are replaced by two phenyl groups and one methyl group, was used as a first monomer:

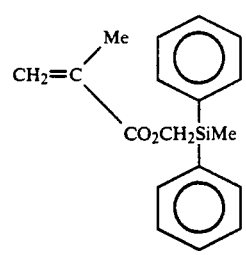
(6)

A copolymer of the first and second monomers having a copolymerization ratio of 8:1 and a molecular weight of about 800,000 was dissolved in cyclohexane, and the copolymer solution of 30 g/l was used as the positive-type resist material of the second embodiment.

The resist material of the second embodiment is coated on a silicon wafer to a thickness of about 3000 Å. After a baking process, the resist layer was subjected to an e-beam exposure step at an accelerating voltage of 20 KeV. After the exposure, the resist layer was developed in a 3:2 mixed solution of n-octylalcohol and methylalcohol for 5 minutes. It was found that the resist material had a sensitivity of about 8.0 $\mu C/cm^2$.

As a test for obtaining data of the resistance to an oxygen plasma, the resist material of the second embodiment was subjected to RIE for 20 minutes under the conditions of oxygen gas flow of 50 sccm, vacuum degree of 0.15 Torr and input RF power of 300 watts. The test result revealed that the thickness consumption of the resist layer was about 2200 Å.

3. Third embodiment

In the third embodiment, α-chloroacrylonitrile, wherein the alpha-position of acrylonitrile in formula (4) was substituted by chlorine as shown by the following formula (7), was used as the second monomer.

(7)

As the first monomer, trimethylsilylmethyl methacrylate was used which is the same monomer used in the first embodiment.

A copolymer of the first and second monomers having a copolymerization ratio of 7:2 and a molecular weight of about 800,000 was dissolved in ethylbenzene, and the copolymer solution of 60 g/l was used as the positive-type resist material of the second embodiment.

The resist material of the third embodiment is coated on a silicon wafer to a thickness of about 3000 Å. After a baking process, the resist layer was subjected to an e-beam exposure step at an accelerating voltage of 20 KeV. After the exposure, the resist layer was developed in 5:1 mixed solution of water and ethylalcohol for 10 minutes. The sensitivity curve of this resist material is shown by curve B of FIG. 4. It was found that the resist material has a sensitivity of about 9.6 $\mu C/cm^2$.

As a test for obtaining data of the resistance against oxygen plasma, the resist material of the third embodiment was subjected to RIE for 20 minutes under the conditions of oxygen gas flow of 50 sccm, vacuum degree of 0.15 Torr and input electrical discharge power of 300 watts. The test result revealed that the thickness consumption of the resist layer was about 3000 Å.

4. Comparison test

(1) Comparison data 1

Toluene solution of a homopolymer of trimethylsilylmethyl methacrylate was used as a resist material for comparison tests. Test pieces were formed and thereafter exposed in the same way as in the previous embodiments. The resist layer was developed in a 10:1 mixed solution of 2-propanol and water for 20 minutes. It was found that the resist material had a sensitivity of about 14 $\mu C/cm^2$ and, as the data of the resistance to an oxygen plasma, thickness a consumption of 1000 Å was obtained under the same test conditions.

In FIG. 4, the sensitivity of the homopolymer of trimethylsilylmethyl methacrylate is shown by curve C.

(2) Comparison data 2

The resist material of the first lower resist layer 4 in FIGS. 1 and 2, which is used for leveling the substrate surface, was subjected to an oxygen plasma test for obtaining data of its resistance to an oxygen plasma. The test conditions were the same as those applied in the previous embodiments. A resist layer of novolak resin, having the trade name of OFPR-800 and sold by Tokyo-Oka-Kogyo, revealed a thickness consumption of 12 microns, which is much larger than the corresponding data obtained for in the first through third embodiments of the invention.

5. Effects of the embodiments

(1) Resistance against oxygen plasma

As explained above in connection with the description of the first through third embodiments, of the invention, the respective thickness consumption of the resist layer, when subjected to oxygen-containing plasma etching, were 1000 Å, 2200 Å and 3000 Å respectively. The data show that consumptions were about 1/120, 1/50 and 1/40. Respectively of the consumption data obtained for OFPR-800 of novolak resin.

The resistance to the oxygen plasma is very strong in the use of the subject resist material of the present invention. This is due to the silicon atom contained in the methacrylic acid ester in the copolyer. Therefore, a known homopolymer resist material comprising only a methacrylic acid ester, such as trimethylsilylmethyl methacrylate, also exhibits a strong resistance to an oxygen plasma as described in comparison data (1).

(2) Sensitivity to an e-beam

The resist materials of embodiments 1 through 3 have a sensitivity to e-beam exposure of 6.4, $\mu C/cm^2$, 8.0 $\mu C/cm^2$ and 9.6 $\mu C/cm^2$ respectively. The data show the sensitivity is improved to a value of 1.5 to 2 times that obtained for the known homopolymer methacrylic acid ester. Thus, the resist material of the present invention is of a copolymer comprising a second monomer of either acrylic ester or acrylonitrile, of which the alpha-position is substituted by an electron attracting group, such as a trifluoromethyl group ($CF_3$) and a halogen group (Cl), and that this structure causes easy decomposition of the copolymer by e-beam irradiation.

Another feature of the present invention is that the resist material does not exhibit a turn-over characteristic when it is overexposed to e-beam/X-ray. The conventional positive-type resist material exhibits a negative-type characteristic, as typically shown by the dashed-curve D of FIG. 4, when it is overexposed to e-beam irradiation of, for example, larger than 100 $\mu C/cm^2$.

The present invention may be embodied in other specific forms without departing from the spirit or essential characteristics thereof. The presently disclosed embodiments are therefore to be considered in all respects as illustrative and not restrictive, the scope of the invention being indicated by the appended claims, rather than the foregoing description, and all changes which come within the meaning and range of equivalence of the claims are, therefore, to be embraced therein.

What is claimed is:

1. A method of forming a resist pattern comprising steps of:

forming a first resist layer on a substrate and forming a second resist layer thereon, the material of said second resist layer comprising a copolymer of silicon containing methacrylic ester and acrylic ester, the alpha-position of the acrylic ester being substituted by an electron attracting group;

selectively irradiating, with an e-beam/X-ray, predetermined regions of said second resist layer and removing the selectively irradiated regions of the second resist layer by a developing process and thereby exposing corresponding, underlying regions of the first resist layer; and subjecting the entire surface of the substrate to a dry etching process using an oxygen containing gas.

2. A method of forming a resist pattern comprising steps of:

forming a first resist layer on a substrate and forming a second resist layer thereon, the material of said second resist layer comprising a copolymer of silicon containing methacrylic ester and acrylonitrile, the alpha-position of the acrylonitrile being substituted by an electron attracting group;

selectively irradiating, with an e-beam/X-ray, predetermined regions of said second resist layer and removing the selectively irradiated regions of the second resist layer by a developing process and thereby exposing corresponding, underlying regions of the first resist layer; and subjecting the entire surface of the substrate to a dry etching process using an oxygen containing gas.

* * * * *